(12) United States Patent
Lindsay

(10) Patent No.: US 9,425,133 B2
(45) Date of Patent: Aug. 23, 2016

(54) INTEGRATED CIRCUITS AND METHODS OF FORMING CONDUCTIVE LINES AND CONDUCTIVE PADS THEREFOR

(71) Applicant: Micron Technology, Inc., Boise, ID (US)

(72) Inventor: Roger W Lindsay, Boise, ID (US)

(73) Assignee: Micron Technology, Inc., Boise, ID (US)

(*) Notice: Subject to any disclaimer, the term of this patent is extended or adjusted under 35 U.S.C. 154(b) by 326 days.

(21) Appl. No.: 13/771,117

(22) Filed: Feb. 20, 2013

(65) Prior Publication Data

US 2013/0154104 A1  Jun. 20, 2013

Related U.S. Application Data

(62) Division of application No. 12/861,093, filed on Aug. 23, 2010, now Pat. No. 8,399,347.

(51) Int. Cl.

| | |
|---|---|
| H01L 23/48 | (2006.01) |
| H01L 23/498 | (2006.01) |
| H01L 23/528 | (2006.01) |
| H01L 21/033 | (2006.01) |
| H01L 21/3213 | (2006.01) |
| H01L 21/768 | (2006.01) |
| H01L 27/02 | (2006.01) |
| H01L 23/482 | (2006.01) |

(52) U.S. Cl.
CPC .......... *H01L 23/498* (2013.01); *H01L 21/0337* (2013.01); *H01L 21/32139* (2013.01); *H01L 21/76885* (2013.01); *H01L 23/4824* (2013.01); *H01L 23/528* (2013.01); *H01L 27/0203* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,221,562 B1* | 4/2001 | Boyd et al. | 430/314 |
| 7,012,003 B2* | 3/2006 | Tobben | 438/257 |
| 7,885,114 B2 | 2/2011 | Park et al. | |
| 8,656,321 B1* | 2/2014 | Huckabay et al. | 716/55 |
| 2009/0093121 A1* | 4/2009 | Moon | 438/696 |
| 2009/0146322 A1* | 6/2009 | Weling et al. | 257/786 |
| 2009/0154240 A1 | 6/2009 | Park et al. | |
| 2010/0155959 A1 | 6/2010 | Park et al. | |
| 2010/0244269 A1 | 9/2010 | Kim | |

* cited by examiner

*Primary Examiner* — Matthew W Such
*Assistant Examiner* — Abul Kalam
(74) *Attorney, Agent, or Firm* — Dicke, Billig & Czaja, PLLC

(57) ABSTRACT

An integrated circuit includes circuitry, a first conductor coupled to the circuitry, a conductive pad coupled to the first conductor, and a second conductor coupled to the conductive pad. The second conductor would be floating but for its coupling to the conductive pad. The second conductor may be spaced apart from the first conductor by a distance that is substantially equal to a width of a merged spacer that was formed from a merging of single sidewall spacers over a conductive material from which the first and second conductors were formed.

19 Claims, 20 Drawing Sheets

INTEGRATED CIRCUITS AND METHODS OF FORMING CONDUCTIVE LINES AND CONDUCTIVE PADS THEREFOR

RELATED APPLICATION

This application is a divisional of U.S. application Ser. No. 12/861,093, titled "INTEGRATED CIRCUITS AND METHODS OF FORMING CONDUCTIVE LINES AND CONDUCTIVE PADS THEREFOR," filed Aug. 23, 2010 and issued as U.S. Pat. No. 8,399,347 on Mar. 19, 2013, which is commonly assigned and incorporated entirely herein by reference.

FIELD

The present disclosure relates generally to integrated circuits and in particular the present disclosure relates to integrated circuits and methods of forming conductive lines and conductive pads therefor.

BACKGROUND

Integrated circuits, such as memory devices, are continually being reduced in size. As such, the size of the features that form the integrated circuits, such as conductive lines, is also being decreased. For example, the internal lines, e.g., control signal lines, address signal lines, and DQ signal lines, within a memory device, such as dynamic random access memory (DRAM), flash memory, static random access memory (SRAM), ferroelectric (FE) memory, etc., are becoming smaller. In some applications, these internal lines may be connected to conductive pads, e.g., sometimes called "landing" pads, of the memory device, such as conductive pads mounted on a memory chip (e.g., memory die). For example, the conductive pads may be connected to pins or other conductive pads on a printed circuit board that forms a portion of a memory package.

Pitch is a quantity commonly used when addressing the spacing between neighboring features, such as adjacent conductive lines, in an integrated circuit. For example, pitch may be defined as the center-to-center distance between two adjacent lines. Lines are typically defined by spaces between adjacent lines, where the spaces may be filled by a material, such as a dielectric. As a result, pitch can be viewed as the sum of the width of a line and of the width of the space on one side of the line separating that line from an adjacent line. However, due to factors such as optics and light or radiation wavelength, photolithography techniques each have a minimum pitch below which a particular photolithographic technique cannot reliably form lines. Thus, the minimum pitch of a photolithographic technique is an obstacle to continued line size reduction.

"Pitch multiplication," such as "pitch doubling," is commonly used for extending the capabilities of photolithographic techniques beyond their minimum pitch. The pitch is actually reduced by a certain factor during "pitch multiplication." For example, the pitch is halved during "pitch doubling."

Conductive pads can be larger than the conductive lines and the pitch, e.g., especially when using pitch multiplication, making it difficult to couple a conductive pad to a line without contacting an adjacent line with a single conductive pad or without conductive pads coupled to adjacent lines contacting each other, thereby shorting the adjacent lines together. Therefore, an additional mask is sometimes used during the pitch-multiplication process to redistribute portions of the lines to increase the spacing where the conductive pads are to be coupled.

For the reasons stated above, and for other reasons stated below which will become apparent to those skilled in the art upon reading and understanding the present specification, there is a need in the art for alternative pitch multiplication techniques.

DETAILED DESCRIPTION

Figure 1:
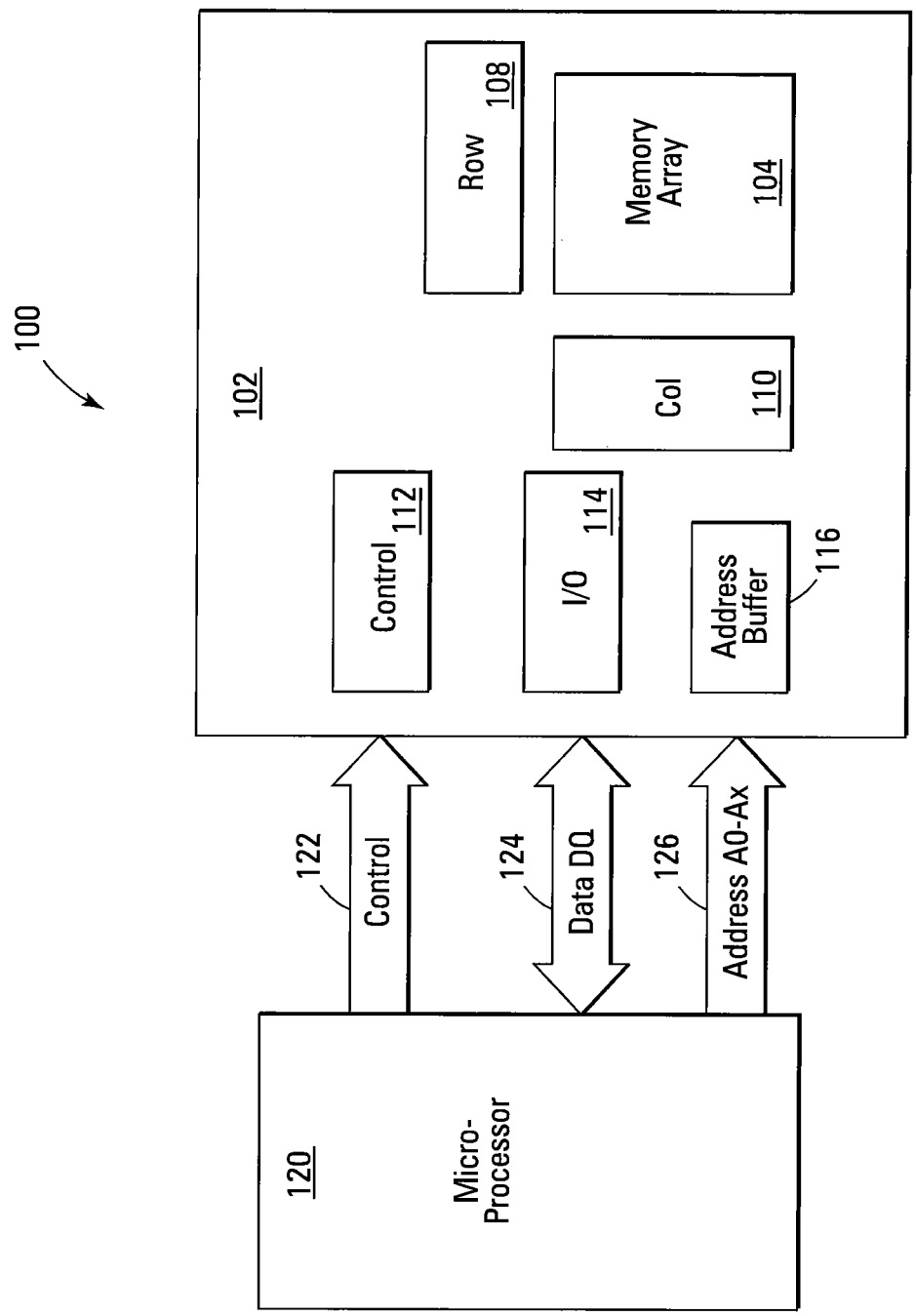
FIG. 1 is a simplified block diagram of an electronic system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof. The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The following detailed description is, therefore, not to be taken in a limiting sense.

FIG. 1 is a simplified block diagram of an electronic system, such as a memory system 100, that includes an integrated circuit device, such as an integrated circuit memory device 102. Memory device 102 may be a flash memory device, e.g., a NAND memory device, a DRAM, an SDRAM, etc., that includes an array of memory cells 104 an address decoder 106, row access circuitry 108, column access circuitry 110, control circuitry 112, Input/Output (I/O) circuitry 114, and an address buffer 116. Memory system 100 includes an external microprocessor 120, such as a memory controller or other external host device, electrically connected to memory device 102 for memory accessing as part of the electronic system.

The memory device 102 receives control signals (which represent commands) from the processor 120 over a control link 122. Memory device 102 receives data signals (which represent data) over a data (DQ) link 124. The memory cells are used to store the data. Address signals (which represent addresses) are received via an address link 126 that are decoded at address decoder 106 to access the memory array 104. Address buffer circuit 116 latches the address signals. The memory cells are accessed in response to the control signals and the address signals.

One or more lines of the control link 122, DQ link 124, and address link 126 may be coupled to conductive pads (not shown in FIG. 1), such as landing pads, e.g., bond pads, formed on memory device 102. The conductive pads may be connected to circuitry of memory device 102, such as memory array 104, address decoder 106, row access circuitry 108, column access circuitry 110, control circuitry 112, Input/Output (I/O) circuitry 114, and/or address buffer 116 by conductors, e.g., conductive lines, formed in accordance with embodiments of the disclosure. The conductive pads may be connected to the conductors in accordance with embodiments of the disclosure.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

FIGS. 2A-2E are plan views of an integrated circuit device, e.g., memory device 102 of FIG. 1, during various stages of fabrication. FIGS. 3A-3G are cross-sectional views of the integrated circuit device of FIGS. 2A-2E, during various stages of fabrication.

Figure 2A:
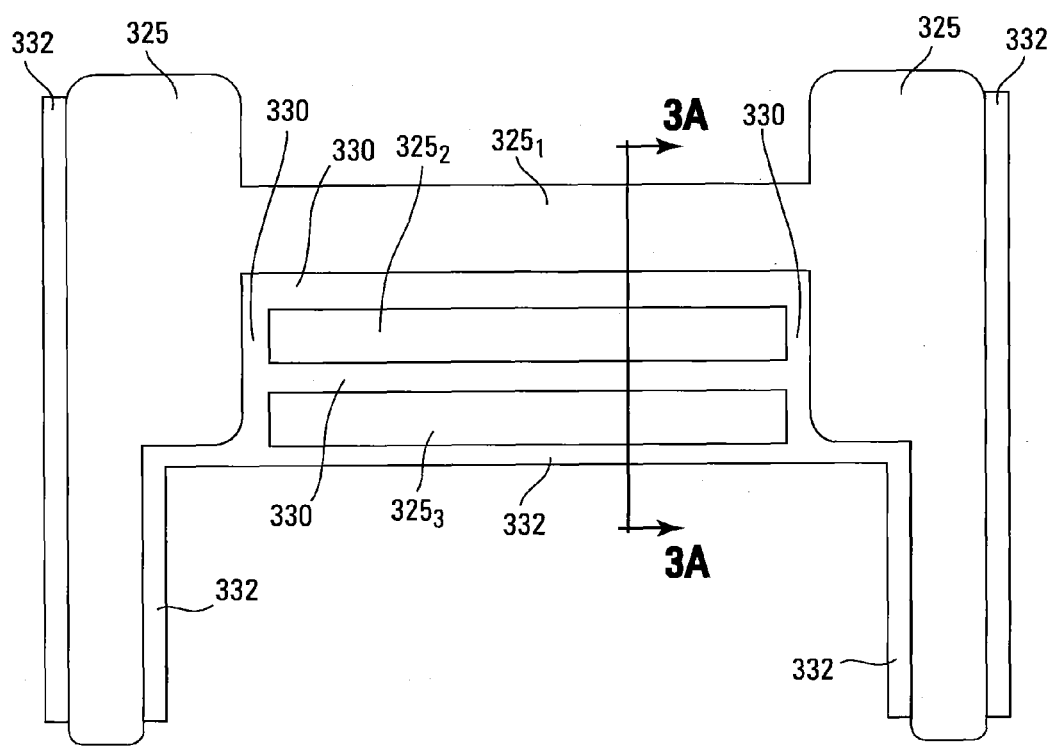
FIGS. 2A-2E are plan views of an integrated circuit device, during various stages of fabrication, according to another embodiment.
Figure 3A:
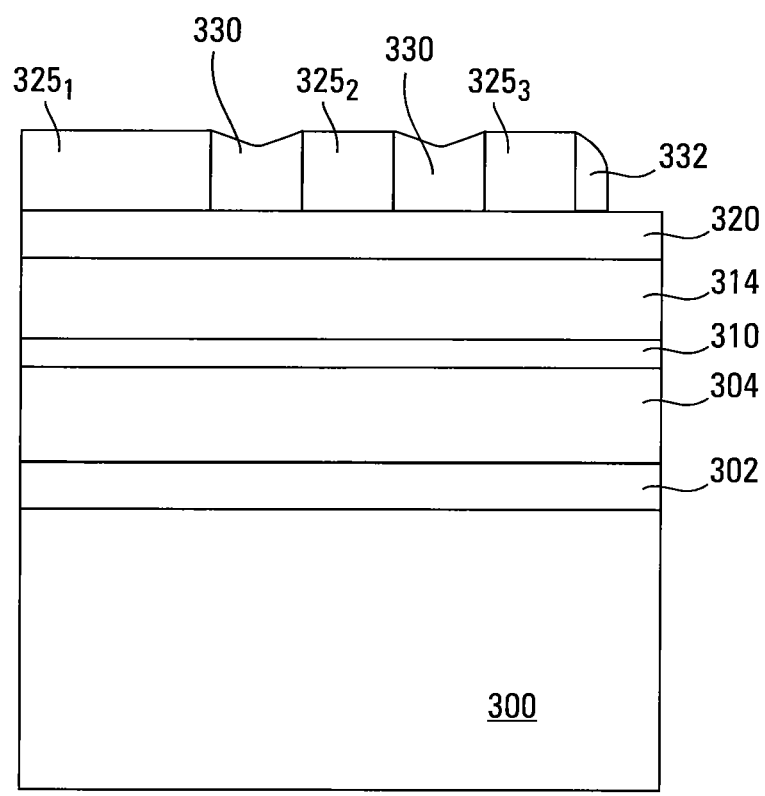
FIGS. 3A-3G are cross-sectional views of the integrated circuit device of FIGS. 2A-2E, during various stages of fabrication.

FIG. 3A is a cross-sectional view taken along line 3A-3A of FIG. 2A. As shown in FIG. 3A, a conductor 302 is formed over a semiconductor 300 that, in some embodiments, may be comprised of silicon that may be conductively doped to have a p-type or n-type conductivity. Conductor 302 is generally formed of one or more conductive materials and may be, for example, metal, such as aluminum, copper, gold, silver, tungsten, metal nitride, e.g., tantalum nitride, titanium nitride, tungsten nitride, etc.

A sacrificial material 304, such as carbon, nitride, etc., is then formed over conductor 302. An anti-reflective material 310, such as a dielectric anti-reflective coating (DARC), may then be formed over sacrificial material 304. A sacrificial material 314, such as carbon, nitride, etc., is then formed over anti-reflective material 310. An anti-reflective material 320, such as a dielectric anti-reflective coating (DARC), may then be formed over sacrificial material 314. In general, sacrificial materials 304 and 314 may be chosen to protect and/or pattern underlying layers while allowing their subsequent selective removal.

A mask, e.g., of photoresist, is formed over anti-reflective material 320 and is patterned to form mask segments 325, as shown in FIGS. 2A and 3A. A dielectric, e.g., of silicon nitride, oxide, etc., is formed over mask segments 325 and anti-reflective material 320, e.g., using a blanket deposition, atomic layer deposition, chemical vapor deposition, etc. Portions of the dielectric are then anisotropically removed, e.g., until the dielectric is substantially removed (e.g., removed) from the upper surfaces of mask segments 325 and the upper surfaces of mask segments 325 are exposed.

The anisotropic removal of the dielectric forms a spacer 330 (e.g., a line) interposed between successively adjacent mask segments 325$_1$ and 325$_2$ and a spacer 330 interposed between successively adjacent mask segments 325$_2$ and 325$_3$. A spacer 330 substantially fills the space between adjacent mask segments 325$_1$ and 325$_2$ and the space between adjacent mask segments 325$_2$ and 325$_3$. For example, successively adjacent mask segments 325$_1$ and 325$_2$ and successively adjacent mask segments 325$_2$ and 325$_3$ are spaced so that spacers 330 substantially fill, e.g., span the entirety of the spaces therebetween when the anisotropic removal exposes the upper surfaces of mask segments 325.

Spacers 330 may be viewed as being a merging of single sidewall spacers formed on adjacent sidewalls of adjacent mask segments, such as adjacent mask segments 325$_1$ and 325$_2$ and adjacent mask segments 325$_2$ and 325$_3$. The anisotropic removal of the dielectric also forms a sidewall spacer 332 (e.g., a line) from the dielectric on the remaining (e.g., opposite facing) sidewall of mask segment 325$_3$ and on the sidewalls of the remaining mask segments 325, as shown in FIG. 2A. For example, sidewall spacer 332 may be viewed as a single sidewall spacer and may be about half as thick as spacers 330, for some embodiments, meaning that spacers 330 may be about double thickness. A spacer 330 loops around mask segment 325$_2$, and a spacer 330 and a spacer 332 loop around mask segment 325$_3$, as shown in FIG. 2A.

Figure 3B:
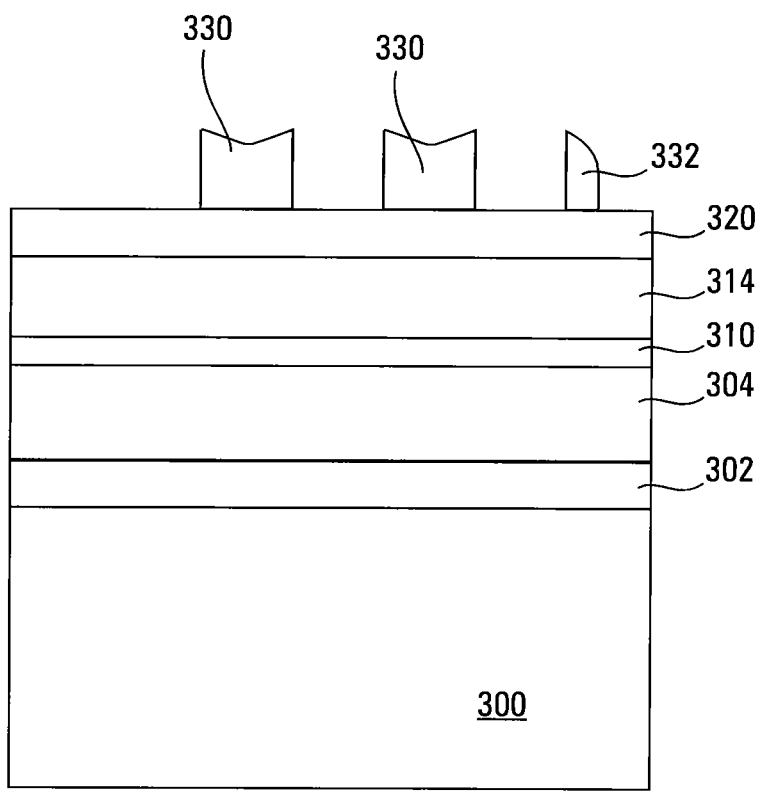
Figure 3C:
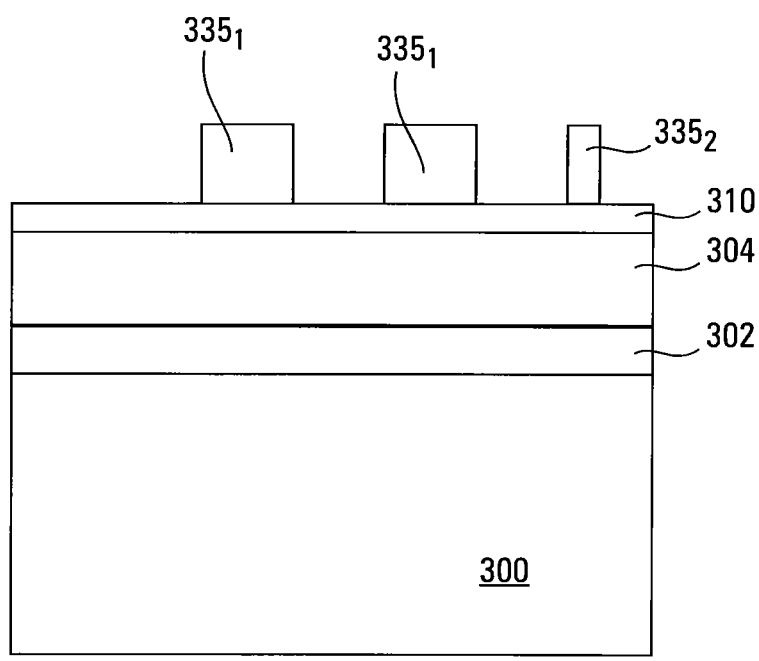

Mask segments 325 are removed in FIG. 3B, e.g., using an etch selective to mask segments 325, stopping on an upper surface of anti-reflective material 320 and leaving spacers 330 and 332. The pattern of spacers 330 and 332 is transferred to sacrificial material 134 (and anti-reflective material 310, if included), forming segments 335$_1$ of sacrificial material 314 having the pattern of spacers 330 and segments 335$_2$ of sacrificial material 314 having the pattern of spacers 332 over anti-reflective material 310. For example, spacers 330 and 332 form a pattern for exposing portions of anti-reflective material 320 and sacrificial material 314 for removal. The exposed portions of anti-reflective material 320 and sacrificial material 314 are removed in FIG. 3C, leaving segments 335$_1$ of sacrificial material 314 that were covered by spacers 330 and segments 335$_2$ of sacrificial material 314 that were covered by spacers 332 over anti-reflective material 310. The spacers 330 and 332 and any anti-reflective material 320 remaining over segments 335 may then be removed from segments 335.

The width of segments 335$_1$ is substantially the same width as spacers 330 in FIGS. 2A and 3A-3B, in that the width of spacers 330 is transferred to sacrificial material 314. The width of segments 335$_2$ is substantially the width of spacers 332 in FIGS. 2A and 3A-3B, in that the width of spacers 332 is transferred to sacrificial material 314. Segments 335$_1$ and 335$_2$ will have substantially the same pattern as spacers 330 and 332. For example, the adjacent segments 335$_1$ in FIG. 3C may form portions of a closed loop that corresponds to the spacer 330 that loops around mask segment 325$_2$ in FIG. 2A, and adjacent segments 335$_1$ and 335$_2$ in FIG. 3C may form portions of a closed loop that corresponds to the spacers 330 and 332 that loop around mask segment 325$_3$ in FIG. 2A.

Figure 2B:
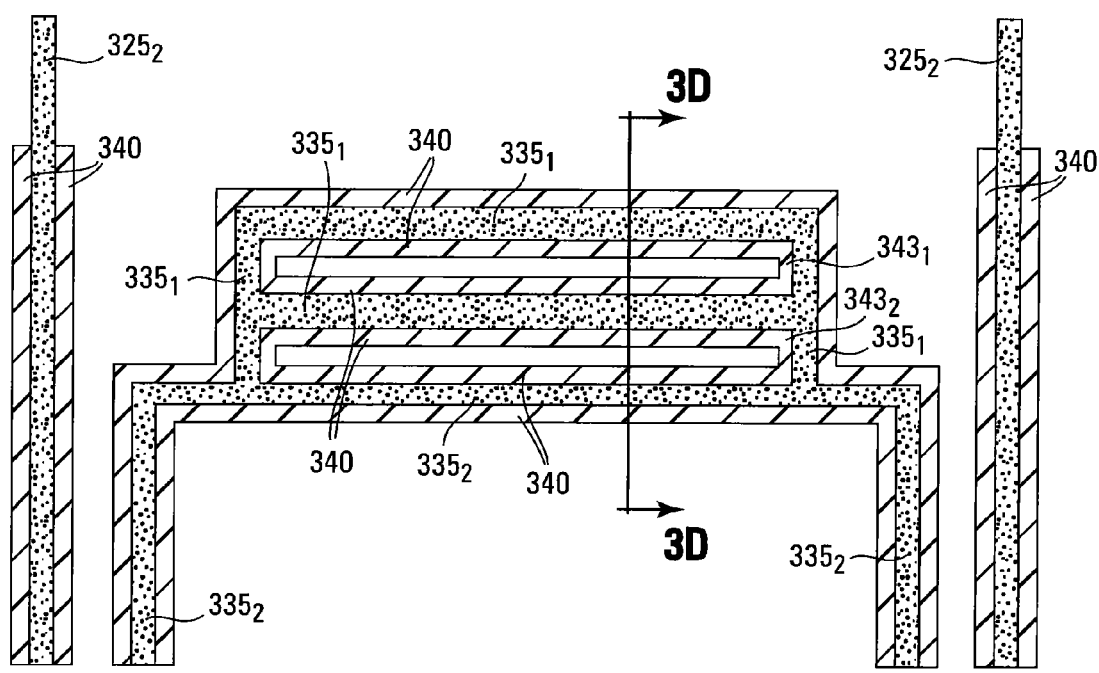
Figure 3D:
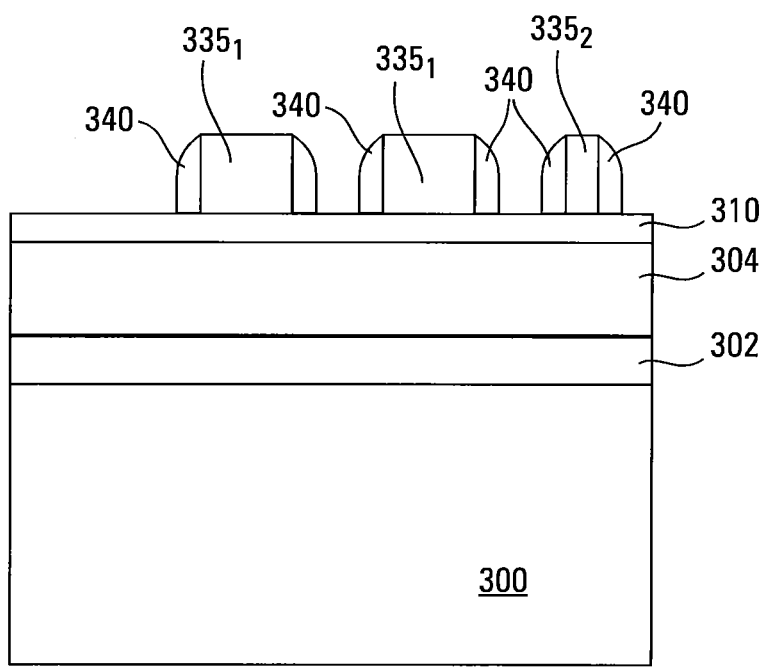

FIG. 3D is a cross-sectional view taken along line 3D-3D of FIG. 2B. A dielectric, e.g., of silicon nitride, oxide, etc., is formed over segments 335 and anti-reflective material 310, e.g., using a blanket deposition, atomic layer deposition, chemical vapor deposition, etc. Portions of the dielectric are then anisotropically removed so that remaining portions of the dielectric layer self align with and form spacers 340 on sidewalls of segments 335 in FIGS. 2B and 3D. For example, the anisotropic removal selectively removes horizontal portions of the dielectric layer, exposing the upper surfaces of segments 335 and portions of the upper surface of anti-reflective material 310.

Some of the spacers 340 form closed loops $343_1$ and $343_2$ (FIG. 2B). Closed loop $343_1$ results from forming spacers 340 on the sidewalls of the adjacent segments $335_1$ that form portions of the closed loop that corresponds to the spacer 330 that loops around mask segment $325_2$ in FIG. 2A, and closed loop $343_2$ results from forming spacers 340 on the sidewalls of the adjacent segments $335_1$ and $335_2$ that form portions of the closed loop that corresponds to the spacers 330 and 332 that loop around mask segment $325_3$ in FIG. 2A.

Figure 2C:
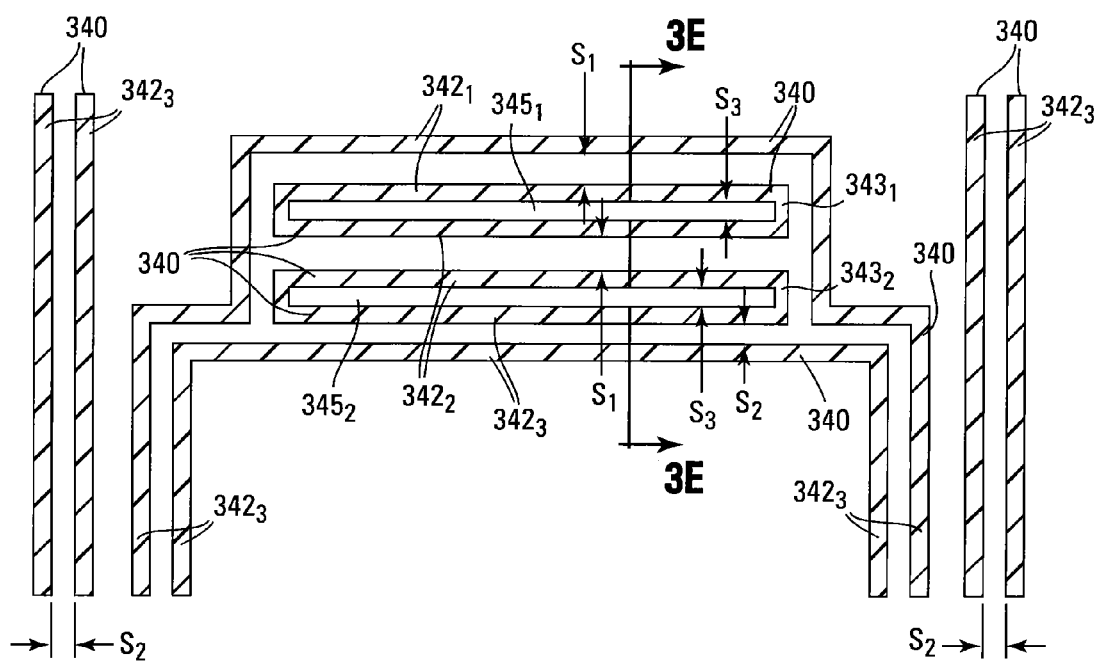
Figure 3E:
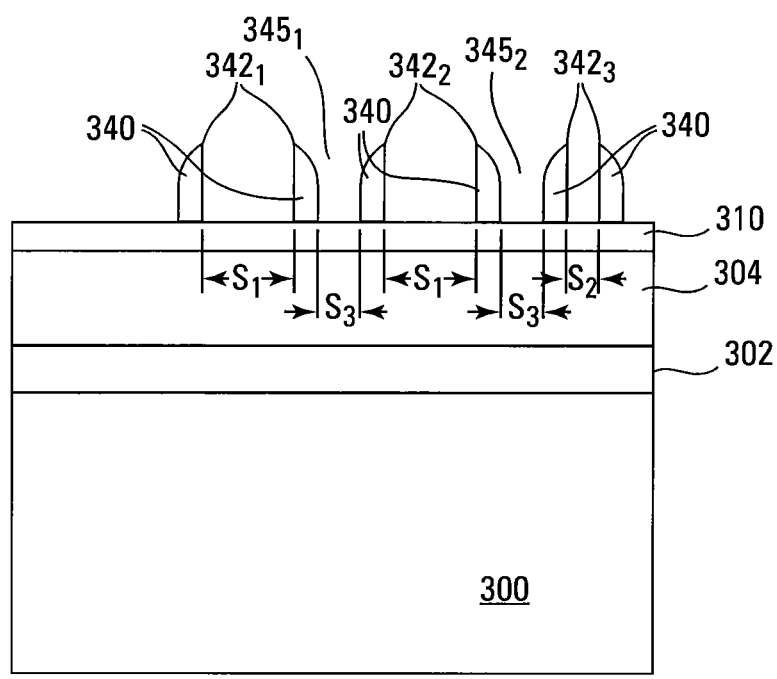

FIG. 3E is a cross-sectional view taken along line 3E-3E of FIG. 2C. Segments 335 are removed in FIGS. 2C and 3E, e.g., using an etch selective to segments 335, stopping on an upper surface of anti-reflective material 310 and leaving spacers 340 (e.g., lines) that correspond one-to-one with lines to be formed from conductor 302. For example, a pair $342_1$ of successively adjacent spacers 340, a pair $342_2$ (successively adjacent to pair $342_1$) of successively adjacent spacers 340, and a pair $342_3$ (successively adjacent to pair $342_2$) of successively adjacent spacers 340 are formed over anti-reflective material 310, as shown in FIGS. 2C and 3E.

A distance (e.g., spacing $S_1$) between adjacent spacers 340 of pairs $342_1$ and $342_2$ may be substantially the same as (e.g., the same as) the width of a segment $335_1$ (FIG. 3D) and may thus be substantially the same as the width of a spacer 330 (FIGS. 2A and 3B), e.g., a merged spacer. For example, the width of spacers 330 is transferred to anti-reflective material 310. A distance (e.g., spacing $S_2$) between adjacent spacers 340 of pair $342_3$ may be substantially the same as (e.g., the same as) the width of a segment $335_2$ (FIG. 3D) and may thus be substantially the same width as a spacer 332 (FIGS. 2A and 3B), e.g., a single spacer. For example, the width of spacers 332 is transferred to anti-reflective material 310. For some embodiments, the spacing $S_2$ may be about half of the spacing $S_1$, in that spacers 332 may be about half as wide as spacers 330.

A space $345_1$ in the center of the closed loop $343_1$ separates successive pairs $342_1$ and $342_2$ of successive spacers 340 from each other (e.g., separates the second spacer 340 of pair $342_1$ from the successively adjacent first spacer 340 of pair $342_2$), as shown in FIGS. 2C and 3E. A space $345_2$ in the center of the closed loop $343_2$ separates successive pairs $342_2$ and $342_3$ of successive spacers 340 from each other (e.g., separates the second spacer 340 of pair $342_2$ from the successively adjacent first spacer 340 of pair $342_3$), as shown in FIGS. 2C and 3E. Successive pairs $342_1$ and $342_2$ of successive spacers 340 (e.g., the second spacer 340 of pair $342_1$ and the successively adjacent first spacer 340 of pair $342_2$) may be separated by a particular distance (e.g., the spacing $S_3$), as are successive pairs $342_2$ and $342_3$ of successive spacers 340 (e.g., the second spacer 340 of pair $342_2$ and the successively adjacent first spacer 340 of pair $342_3$), as shown in FIGS. 2C and 3E.

Figure 2D:
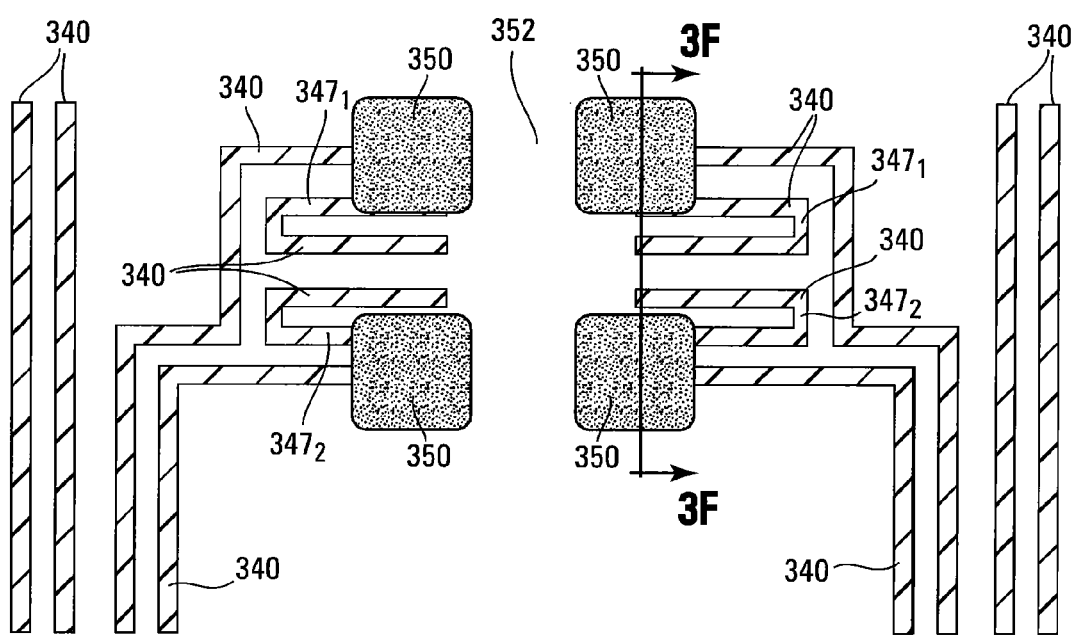

A mask (not shown), e.g., of photoresist, may then be formed over the structure of FIGS. 2C and 3E, i.e., over anti-reflective material 310 and a portion of spacers 340, and patterned for exposing portions of anti-reflective material 310, the portion of spacers 340, and a portion of sacrificial material 304 for removal. The exposed portions of anti-reflective material 310, spacers 340, and sacrificial material 304 are then removed, as shown in FIG. 2D, such as by etching, stopping on conductor 302, thus exposing a portion of conductor 302. This removal process may be referred to as chopping and forms the ends of the spacers 340. For example, the chopping process forms an opening 352 through the spacers 340 that separates each spacer 340 (e.g., each horizontal spacer 340) at the center of the structure in FIG. 2C into two spacers, through anti reflective material 310, and through sacrificial material 304 and that exposes the portion of conductor 302. That is, there are spacers 340 on either side of opening 352.

Opening 352 also separates closed loop $343_1$ (FIG. 2C) into two opened loops $347_1$, one on either side of the opening 352 (FIG. 2D), and closed loop $343_2$ into two opened loops $347_2$, one on either side of the opening 352 (FIG. 2D). That is, the chopping process opens the closed loops $343_1$ and $343_2$ to respectively form the separated opened loops $347_1$ and $347_2$ therefrom. The opened loops 347 will be transferred to the conductor 302 and will form opened loops from conductor 302 that may form floating conductors, e.g., floating lines.

Figure 3F:
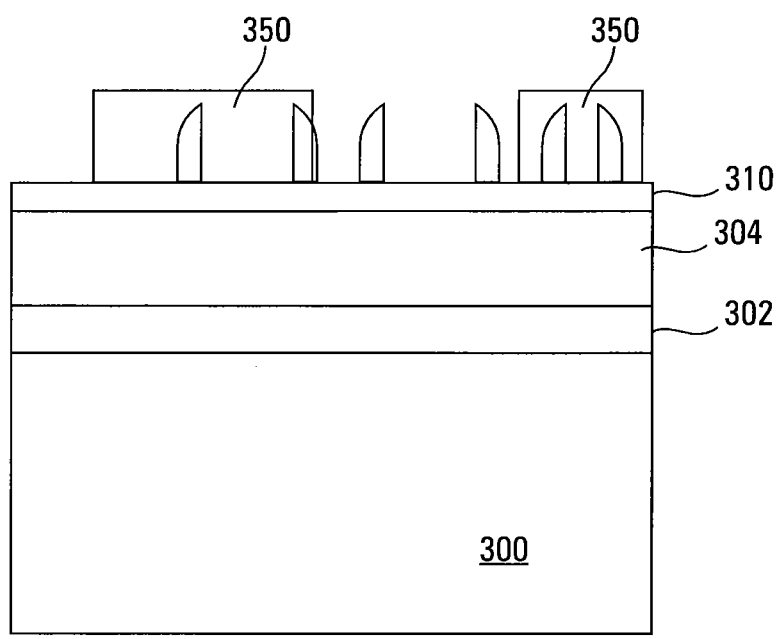

A mask, e.g., of photoresist, may then be formed over the remaining anti-reflective material 310 and the remainder of the spacers 340 and extend over the portion of conductor 302 exposed during chopping (e.g., extend into opening 352). The mask is patterned to form mask segments 350, as shown in FIG. 2D and FIG. 3F, a cross-sectional view taken along line 3F-3F in FIG. 2C. Mask segments 350 and spacers 340 form a pattern that will be transferred to conductor 302, where each mask segment 350 covers a portion of a respective pair of adjacent spacers 340 and extends into opening 352 over the exposed conductor. That is, mask segments 350 correspond one-to-one with conductive pads that may be called landing pads, e.g., bond pads, that will be formed from conductor 302 at the ends of lines that will be formed from conductor 302 and that correspond one-to-one with spacers 340, e.g., the width of conductive lines may be about the same as the width of spacers 340. For example, the conductive lines will have the pattern of the spacers 340 and the conductive pads will have the pattern of mask segments 350.

Figure 2E:
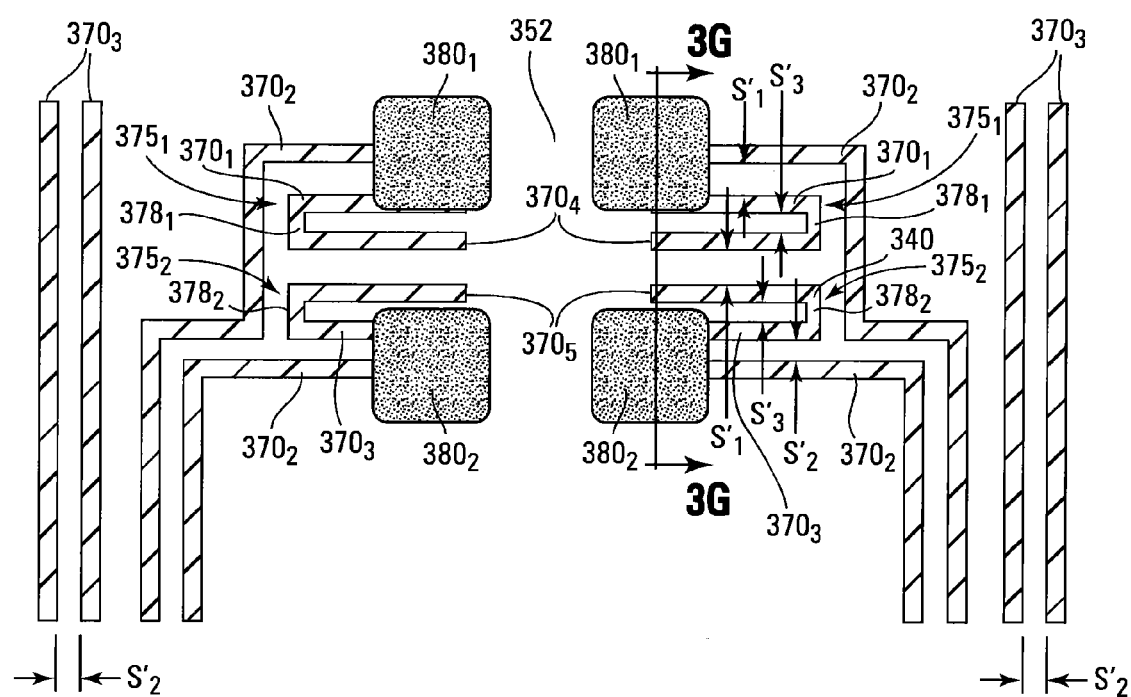
Figure 3G:
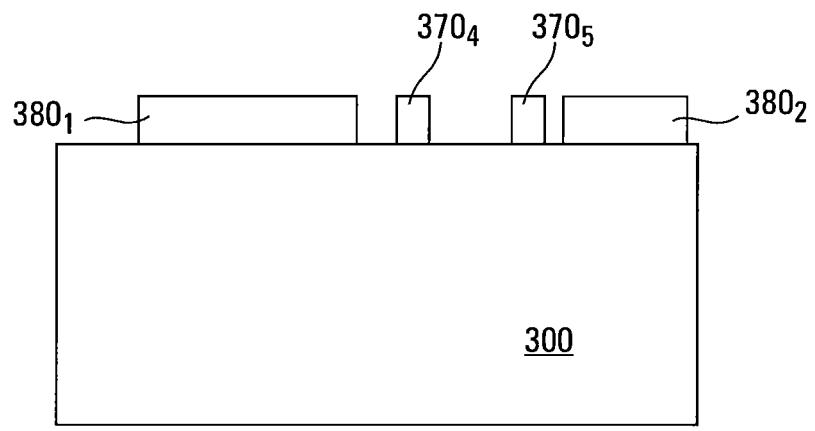

Spacers 340 and mask segments 350 form a pattern for exposing portions of anti-reflective material 310, sacrificial material 304, and conductor 302 for removal. The portions of anti-reflective material 310, sacrificial material 304, and conductor 302 are then removed, e.g., by etching, to form conductive lines 370 (e.g., conductive lines $370_1$ to $370_5$) and conductive pads 380 (e.g., conductive pads $380_1$ and $380_2$), such as landing pads, e.g., bonding pads, from conductor 302 substantially concurrently (e.g., concurrently) (FIG. 2E and FIG. 3G, a cross-sectional view taken along line 3G-3G in FIG. 2E). Note that the width of conductive lines 370 may be about the same as the width of spacers 340. Any anti-reflective material 310, spacers 340, and sacrificial material 304 remaining over conductive lines 370 and conductive pads 380 may then be removed, as shown in FIGS. 2E and 3G.

Each conductive pad $380_1$ may be commonly coupled to (e.g., may be in direct physical contact with) a conductive line $370_1$ and a successively adjacent conductive line $370_2$. For example, each conductive pad $380_1$ may bridge a space between successively adjacent conductive lines $370_1$ and $370_2$. Each conductive pad $380_2$ may be commonly coupled to (e.g., may be in direct physical contact with) a conductive line $370_2$ and a successively adjacent conductive line $370_3$. For example, each conductive pad $380_2$ may bridge a space between successively adjacent conductive lines $370_2$ and $370_3$. A conductive pad 380 and the respective lines 370 coupled thereto may be integral and formed substantially concurrently (e.g., concurrently) from conductor 302. The conductive lines $370_2$ may be electrically coupled to circuitry of an integrated circuit device, such as memory device 102, such that the conductive pads $380_1$ and $380_2$ are coupled to the circuitry of the integrated circuit device through their respective conductive lines $370_2$. Note that there is a conductive pad $380_1$ and a conductive pad $380_2$ on either side of the opening 352 that may be filled with a dielectric.

Each conductive pad $380_1$ may electrically, and physically, couple successively adjacent conductive lines $370_1$ and $370_2$ to each other, and each conductive pad $380_2$ may electrically, and physically, couple successively adjacent conductive lines $370_2$ and $370_3$ to each other. This is because each conductive pad $380_1$ may be too large (e.g., too wide) to contact a respective conductive line $370_2$ without also contacting an adjacent conductive line $370_1$, and each conductive pad $380_2$ is too large (e.g., too wide) to contact a respective conductive line $370_2$ without also contacting an adjacent conductive line $370_3$. However, this does not present a problem, in that each conductive line $370_1$ and each conductive line $370_3$ would be floating but for their coupling to their respective conductive pads $380_1$ and $380_2$.

Each conductive line $370_1$ can be thought of as a portion of a conductor $375_1$. Each conductor $375_1$ has a conductive line $370_1$ coupled directly to a conductive pad $380_1$ and an adjacent conductive line $370_4$ that is physically coupled to and substantially parallel to (e.g., parallel to) the respective conductive line $370_1$, where the conductive lines $370_1$ and $370_4$ may extend in substantially the same direction (e.g., the same direction) as each other. A conductive line $370_1$ and a conductive line $370_4$ may be physically coupled by a line segment $378_1$ interposed between and connected to the conductive lines $370_1$ and $370_4$, where the line segment $378_1$ may be substantially perpendicular to (e.g., perpendicular to) conductive lines $370_1$ and $370_4$. Conductive line $370_1$, conductive line $370_4$, and line segment $378_1$ of each conductor $375_1$ form an opened-loop structure having substantially the same pattern (e.g., the same pattern) as an opened loop $347_1$ in FIG. 2D that is transferred to conductor 302 and that originates from looping the merged spacers 330 around mask segment $325_2$ in FIG. 2A. For example, each conductor $375_1$ may be substantially "C" shaped. Note that there may be conductor $375_1$ on either side of opening 352.

A distance (e.g., spacing $S_3$') between the conductive lines $370_1$ and $370_4$ of each conductor $375_1$ may be substantially the same as the spacing $S_3$ in FIGS. 2C and 3E. A distance (e.g., spacing $S_1$') between the conductive lines $370_1$ and $370_2$ commonly coupled to each conductive pad $380_1$ may be substantially the same as the spacing $S_1$ in FIGS. 2C and 3E, in that the spacing $S_1$ is substantially transferred to conductor 302. As indicated above in conjunction with FIGS. 2C and 3E, the spacing $S_1$ may be substantially the same as the width of segments $335_1$ (FIG. 3D) and may thus be substantially the same as the width of merged spacers 330 (FIGS. 2A and 3B). This means that the spacing between conductive lines $370_1$ and $370_2$ commonly coupled to each conductive pad $380_1$ results from a merged spacer 330 and that the spacing $S_1$' may be substantially the same as the width of a merged spacer 330. For example, the width of a merged spacer 330 is substantially transferred as a spacing between conductive lines $370_1$ and $370_2$ commonly coupled to each conductive pad $380_1$.

Each conductive line $370_3$ can be thought of as a portion of a conductor $375_2$. Each conductor $375_2$ has a conductive line $370_3$ directly coupled to a conductive pad $380_2$ and an adjacent conductive line $370_5$ that is physically coupled to and substantially parallel to (e.g., parallel to) the respective conductive line $370_3$, where the conductive lines $370_3$ and $370_5$ may extend in substantially the same direction (e.g., the same direction) as each other. A conductive line $370_3$ and a conductive line $370_5$ may be physically coupled by a line segment $378_2$ interposed between and connected to the conductive lines $370_3$ and $370_5$, where the line segment $378_2$ may be substantially perpendicular to (e.g., perpendicular to) conductive lines $370_3$ and $370_5$. Conductive line $370_3$, conductive line $370_5$, and line segment $378_2$ of each conductor $375_2$ form an opened-loop structure having substantially the same pattern (e.g., the same pattern) as an opened loop $347_2$ in FIG. 2D that originates from looping the combination of a merged spacer 330 and a single spacer 332 around mask segment $325_3$ in FIG. 2A. For example, each conductor $375_2$ may be substantially "C" shaped. Note that there may be conductor $375_2$ on either side of opening 352.

The distance (e.g., spacing) between the conductive lines $370_3$ and $370_5$ of each conductor $375_2$ may be the spacing $S_3$'. The distance (e.g., spacing) between successively adjacent conductors $375_1$ and $375_2$ may be the spacing $S_1$'. That is, the distance (e.g., spacing) between the conductive line $370_4$ of conductor $375_1$ and the successively adjacent line conductive line $370_5$ of conductor $375_2$ may be the spacing $S_1$'. This means that the distance between successively adjacent conductors $375_1$ and $375_2$ results from a merged spacer. The successively adjacent conductive lines $370_4$ and $370_5$, spaced apart by the spacing $S_1$', be interposed between adjacent bond pads $380_1$ and $380_2$, where bond pad $380_1$ is coupled to the conductor $375_1$ with conductive line $370_4$ and bond pad $380_2$ is coupled to the conductor $375_2$ with conductive line $370_5$, as shown in FIG. 2E.

The distance (e.g., spacing $S_2$') between the conductive lines $370_2$ and $370_3$ commonly coupled to each conductive pad $380_2$ may be substantially the same as the spacing $S_2$ in FIGS. 2C and 3E, in that the spacing $S_2$ is substantially transferred to conductor 302. As indicated above in conjunction with FIGS. 2C and 3E, the spacing $S_2$ may be substantially the same as the width of a segment $335_2$ (FIG. 3D) and may thus be substantially the same as the width of a single spacer 332 (FIGS. 2A and 3B). This means that the distance (e.g., spacing) between conductive lines $370_2$ and $370_3$ commonly coupled to each conductive pad $380_2$ results from a single spacer 332 and that spacing $S_2$' may be substantially the same as the width of a single spacer 332.

Figure 4A:
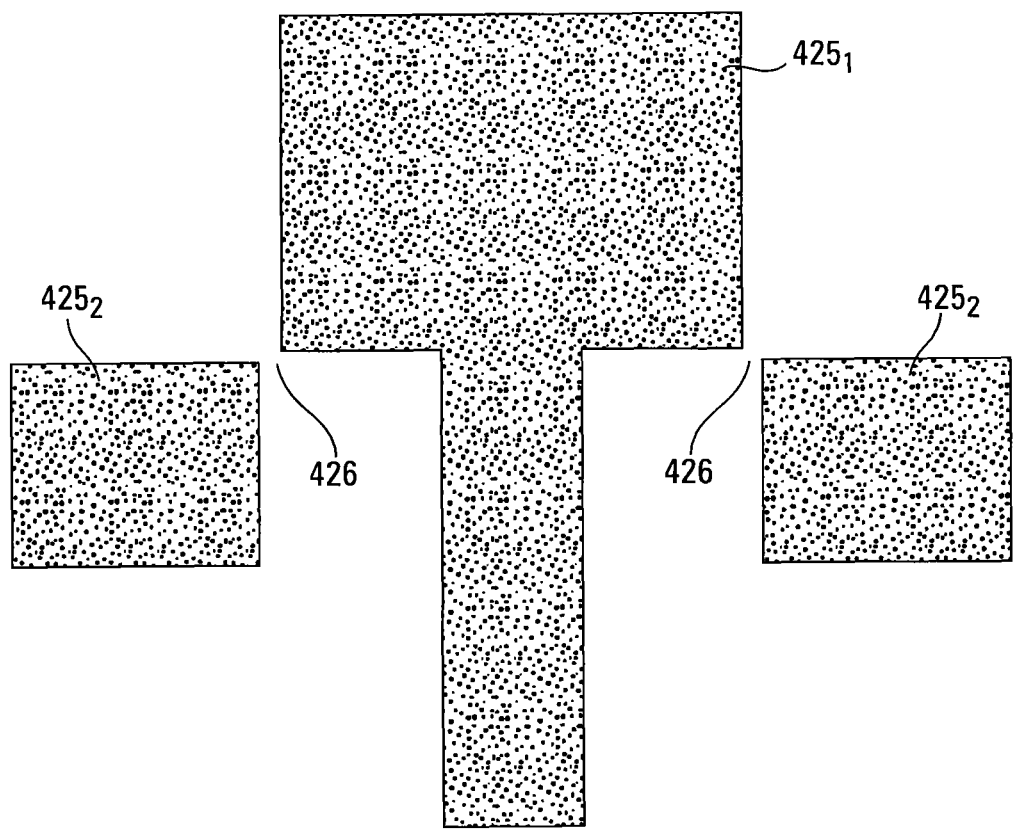
FIGS. 4A-4G are plan views of an integrated circuit device, during various stages of fabrication, according to another embodiment.
Figure 4B:
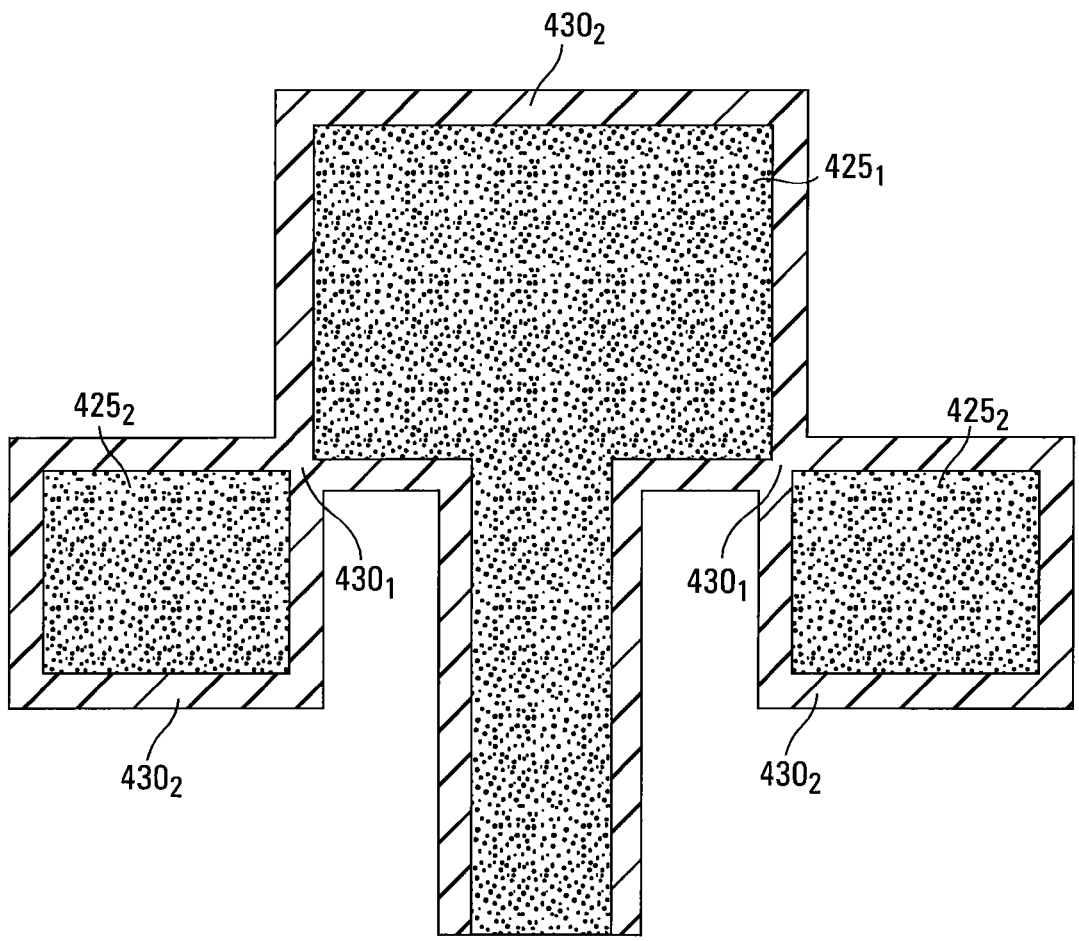
Figure 4C:
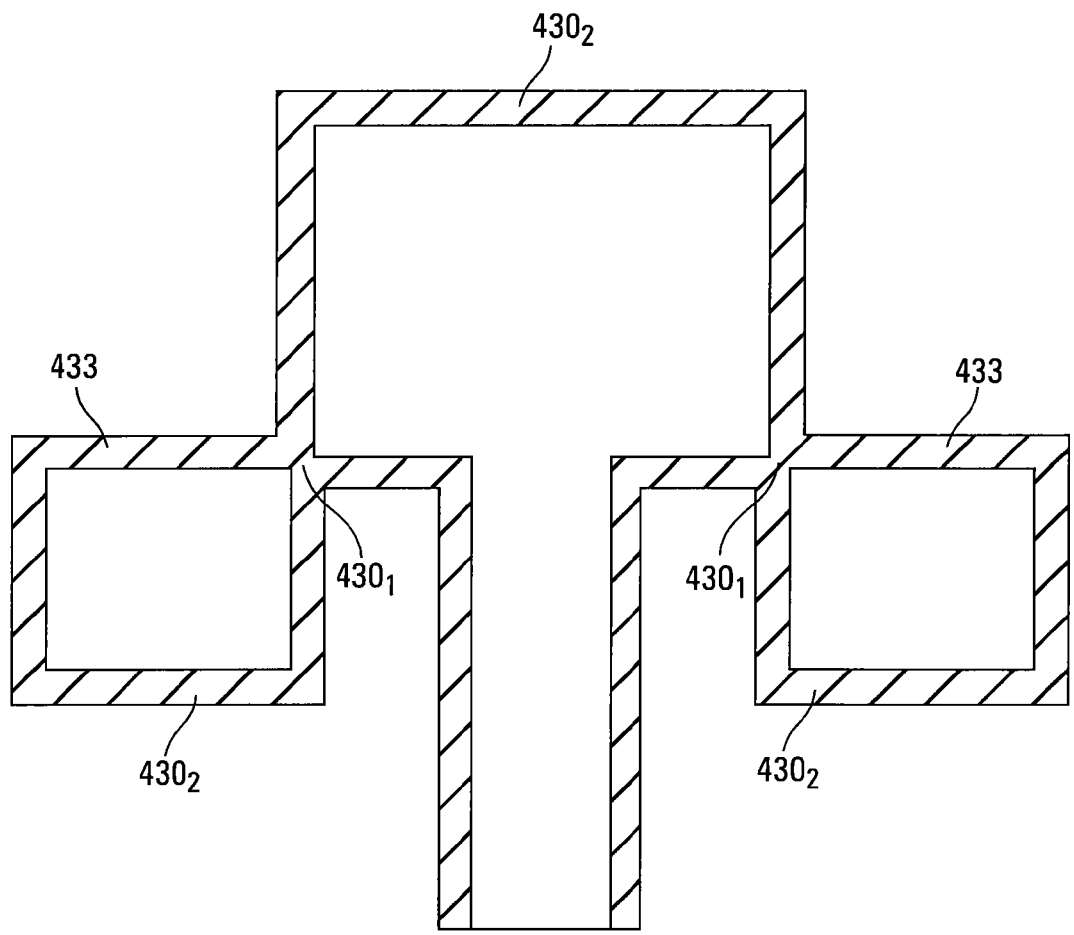
Figure 4D:
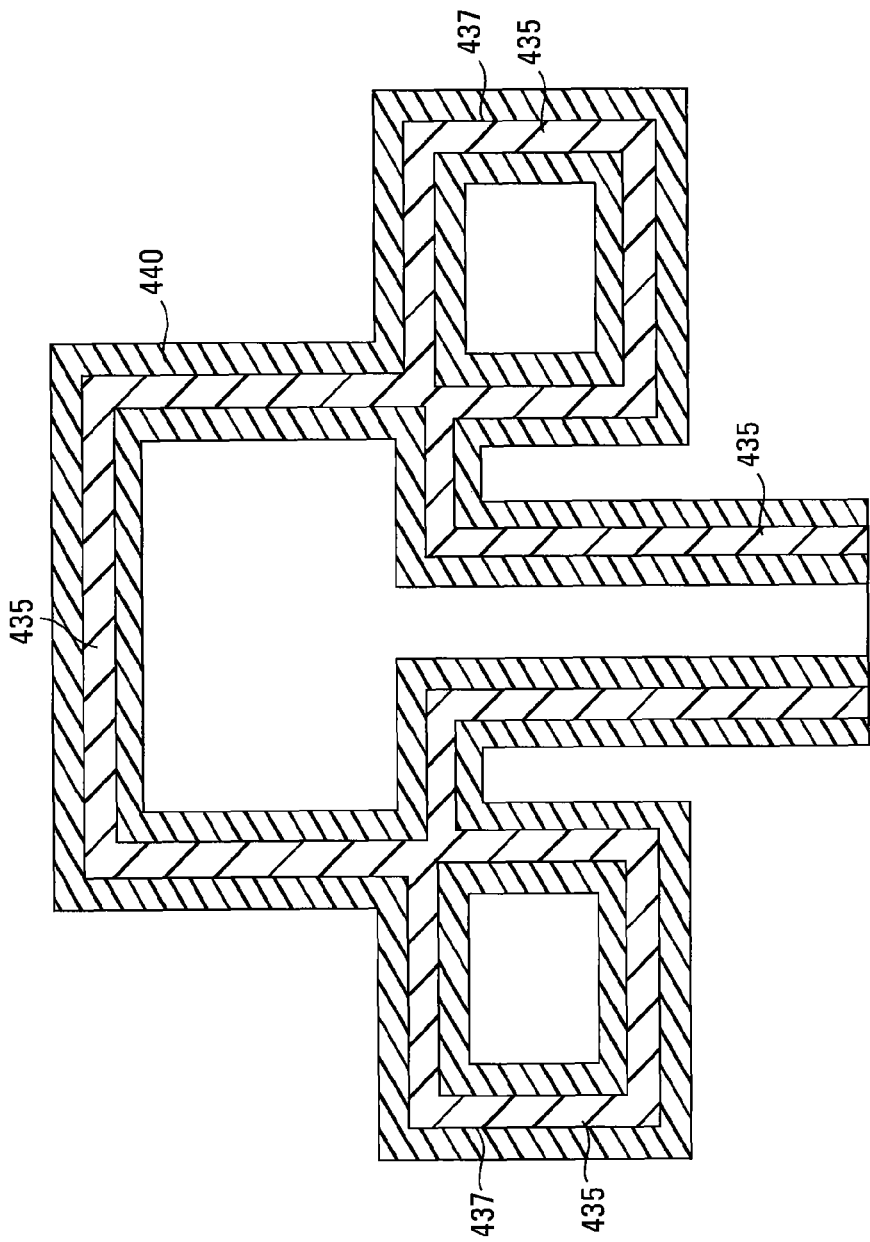

FIGS. 4A-4G are plan views of an integrated circuit device, e.g., memory device 102 of FIG. 1, during various stages of fabrication, according to another embodiment. In FIG. 4A, a mask, e.g., of photoresist is formed and is patterned to form mask segments 425, e.g., in a manner similar to that described above in conjunction with FIGS. 2A and 3A for forming mask segments 325. For example, mask segments 425 may be formed over an anti-reflective material, such as the anti-reflective material 320, that is formed over a sacrificial material, such as the sacrificial material 314, that is formed over another anti-reflective material, such as the anti-reflective material 310, that is formed over another sacrificial material, such as the sacrificial material 304, that is formed over a conductor, such as the conductor 302 that is formed over a semiconductor, such as the semiconductor 300 (see FIG. 3A).

The spaces 426 between the corners of mask segment $425_1$ and the corners of mask segments $425_2$ may be sufficiently large to accommodate merged spacers, e.g., about twice as wide as the thickness of a single sidewall spacer. For some embodiments, the space 426 may be bridged by mask material that is subsequently removed.

Spacers 430, e.g., of oxide or nitride, are then formed on the sidewalls of mask segments 425, e.g., as described above in conjunction with FIGS. 2A and 3A, so that spacers $430_1$ span the spaces 426 between corners of mask segment $425_1$ and the corners of mask segments $425_2$, e.g., spacers $430_1$ are merged spacers that may be about twice the thickness of the single spacers $430_2$. Note that a spacer $430_1$ and a spacer $430_2$ form a closed loop around each mask segment $425_2$.

The mask segments 425 are removed, e.g., using an etch selective to mask segments 425, stopping on an upper surface of the anti-reflective material (e.g., anti-reflective material 320), leaving spacers $430_1$ and $430_2$ (e.g., lines), e.g., as described above in conjunction with FIG. 3B, where a spacer $430_1$ and a spacer $430_2$ form a closed loop 433. The pattern of spacers $430_1$ and $430_2$ is then transferred onto the other anti-reflective material (e.g., anti-reflective material 310), e.g., in a manner similar to that described above in conjunction with FIG. 3C.

For example, spacers $430_1$ and $430_2$ form a pattern for exposing portions of anti-reflective material 320 and the sacrificial material (e.g., sacrificial material 314) for removal. The exposed portions of anti-reflective material 320 and sacrificial material 314 are removed in FIG. 4D, leaving segments 435 of sacrificial material 314, e.g., as described above in conjunction with FIG. 3C, where a segment 435 forms closed loop 437 thereof. Spacers 440, e.g., of oxide or nitride, are then formed on the sidewalls of segments 435 and around the closed loops 437 in FIG. 4D, e.g., as described above in conjunction with FIGS. 2B and 3D. The segments 435 are then removed in FIG. 4E, e.g., as described above in conjunction with FIGS. 2C and 3E, leaving spacers 440 over anti-reflective material 310, where closed loops 443 are formed from the spacers 440 formed around closed loops 437.

Figure 4E:
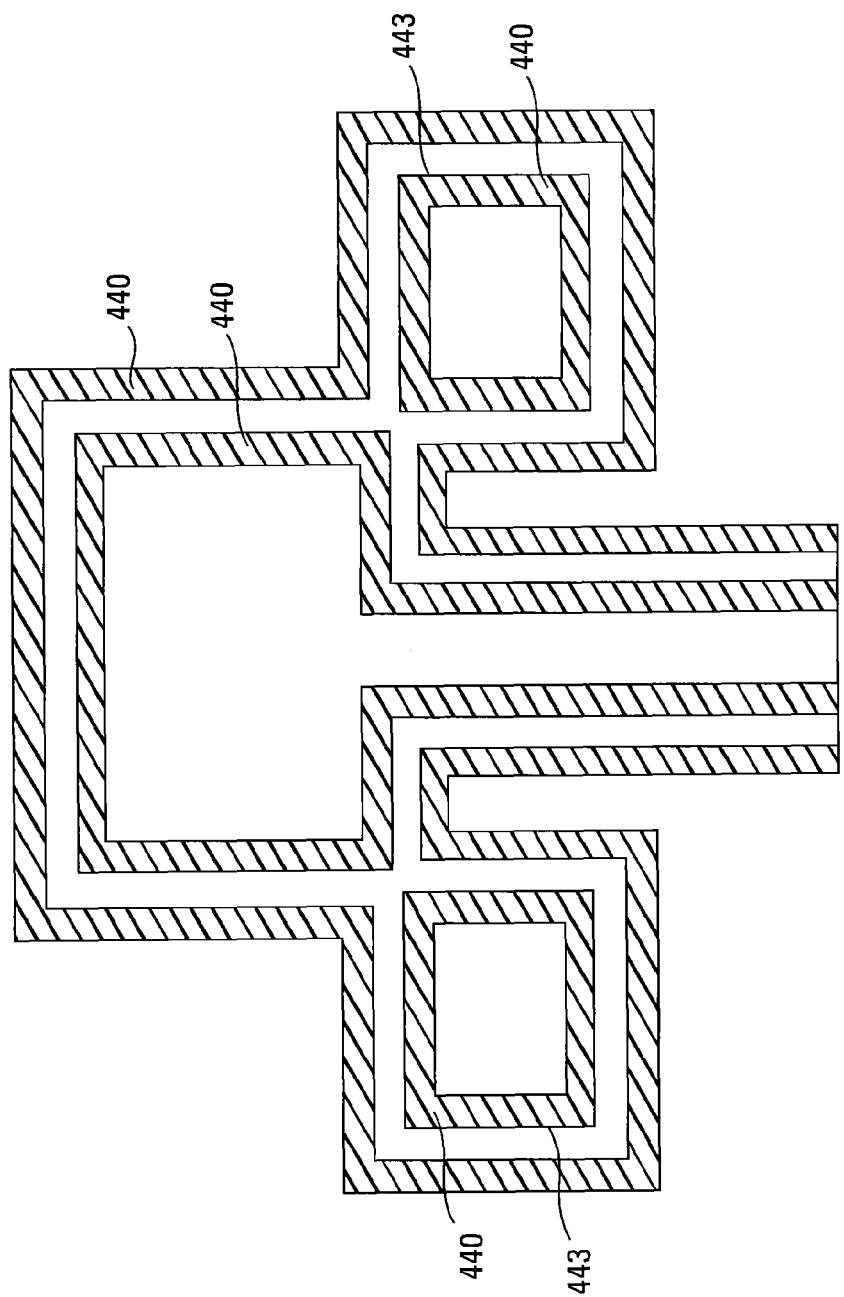
Figure 4F:
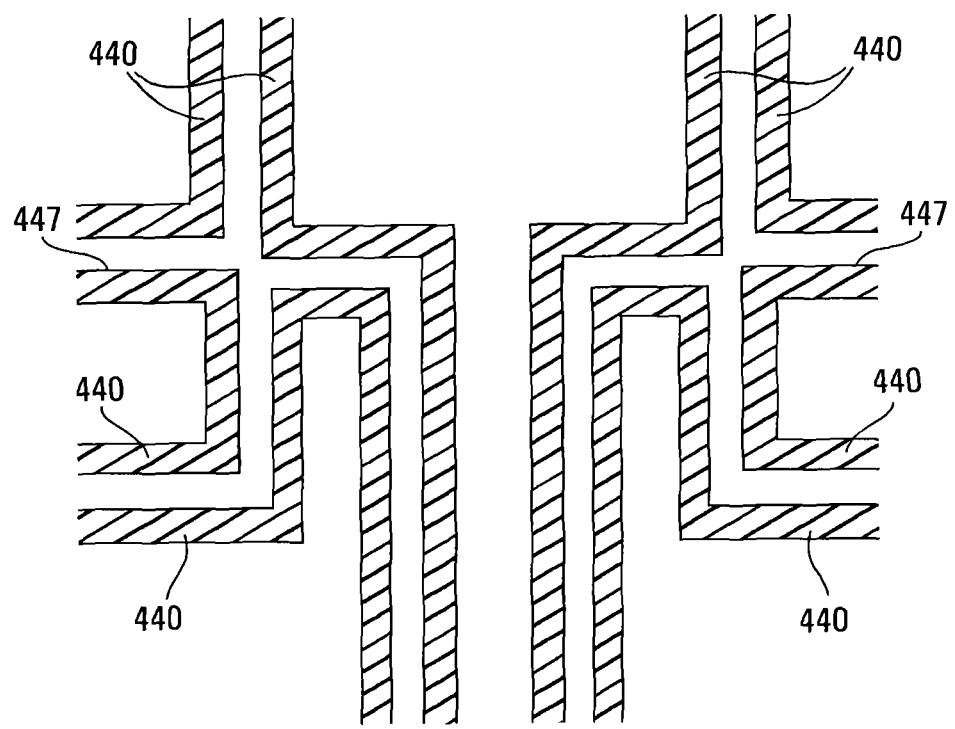

A mask (not shown), e.g., of photoresist, may then be formed over the structure of FIG. 4E, i.e., over anti-reflective material 310 and spacers 440, and patterned for exposing portions of anti-reflective material 310, a portion of the spacers 340, and a portion of the other sacrificial material (e.g., sacrificial material 304) for removal. The exposed portions of anti-reflective material 310, the spacers 340, and sacrificial material 304 are then removed, e.g., as above in conjunction with FIG. 2D, such as by etching, stopping on the conductor (e.g., the conductor 302), thus exposing a portion of the conductor. This removal process forms the ends of the spacers 440, as shown in FIG. 4F. The removal process also opens the closed loops 443 (FIG. 4D) to form opened loops 447 (FIG. 4F) that when transferred to the conductor 302 may form floating lines. As indicted above, in conjunction with FIG. 2D, this removal process may be referred to as a chopping process.

Mask segments (not shown in FIG. 4F) are then formed over the ends of the spacers 440 in FIG. 4F, e.g., as described above in conjunction FIGS. 2D and 3F for mask segments 350. The mask segments and spacers 440 form a pattern that will be transferred to conductor 302. That is, mask segments correspond one-to-one with conductive pads that will be formed from conductor 302 at the ends of lines that will be formed from conductor 302 and that correspond one-to-one with spacers 440. For example, the conductive pads and conductive lines will respectively have the same pattern as the mask segments and spacers 440.

Figure 4G:
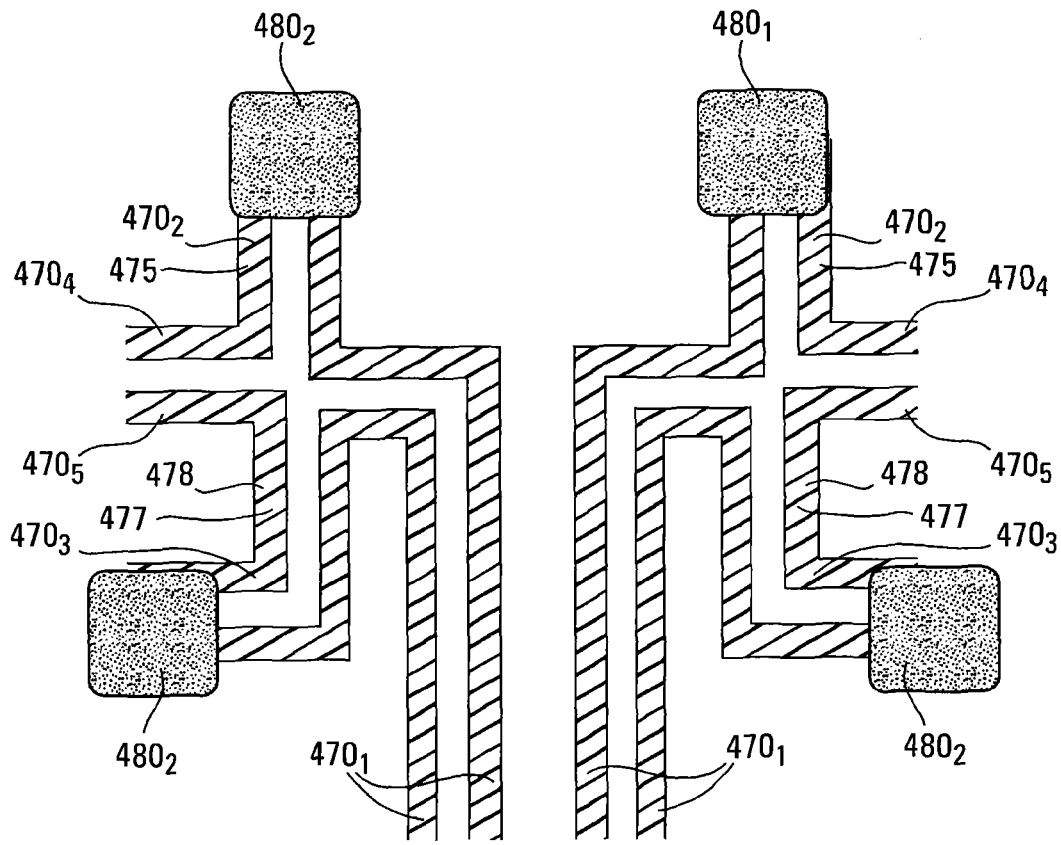

Spacers 440 and the mask segments form a pattern for exposing portions of anti-reflective material 310, sacrificial material 304, and conductor 302 for removal, e.g., as described above in conjunction with FIGS. 2D and 3F. The portions of anti-reflective material 310, sacrificial material 304, and conductor 302 are then removed, e.g., by etching, to form conductive lines 470 (e.g., conductive lines $470_1$ to $470_5$) and conductive pads 480 (e.g., conductive pads $480_1$ and $480_2$), such as landing pads, e.g., bonding pads, substantially concurrently (e.g., concurrently) from conductor 302, as shown in FIG. 4G. Note that the conductive pads 480 correspond one-to-one with the mask segments and the conductive lines 470 correspond one-to-one with the spacers 440 in FIG. 4F.

Each conductive pad $480_1$ may be commonly coupled to (e.g., may be in direct physical contact with) a conductive line $470_1$ and a successively adjacent conductive line $470_2$. For example, each conductive pad $480_1$ may bridge a space between successively adjacent conductive lines $470_1$ and $470_2$. Each conductive pad $480_2$ may be commonly coupled to (e.g., may be in direct physical contact with) a conductive line $470_1$ and a successively adjacent conductive line $470_3$. For example, each conductive pad $480_2$ may bridge a space between successively adjacent conductive lines $470_1$ and $470_3$. A conductive pad 480 and the respective lines 470 coupled thereto may be integral and formed substantially concurrently (e.g., concurrently) from conductor 302.

Each conductive pad $480_1$ may electrically, and physically, couple successively adjacent conductive lines $470_1$ and $470_2$ to each other, and each conductive pad $480_2$ may electrically, and physically, couple successively adjacent conductive lines $470_1$ and $470_3$ to each other. This is because each conductive pad $480_1$ may be too large (e.g., too wide) to contact a respective conductive line $470_1$ without also contacting an adjacent conductive line $470_2$, and each conductive pad $480_2$ may be too large (e.g., too wide) to contact a respective conductive line $470_1$ without also contacting an adjacent conductive line $470_3$. However, this does not present a problem, in that each conductive line $470_2$ and each conductive line $470_3$ would be floating but for their coupling to their respective conductive pads $480_1$ and $480_2$. The conductive lines $470_1$ may be electrically coupled to circuitry of an integrated circuit device, such as memory device 102.

Each conductive line $470_2$ can be thought of as a portion of a conductor 475, and each conductive line $470_3$ can be thought of as a portion of a conductor 477. Each conductor 475 has a conductive line $470_2$ coupled directly to a conductive pad $480_1$ and a conductive line $470_4$ that is physically coupled and may be substantially perpendicular (e.g., perpendicular) to the respective conductive line $470_2$. For example, each conductor 475 may be substantially "L" shaped.

Each conductor 477 has a conductive line $470_3$ coupled directly to a conductive pad $480_2$ and an adjacent conductive line $470_5$ that is physically coupled to and may be substantially parallel to (e.g., parallel to) the respective conductive line $470_3$, where the conductive lines $470_3$ and $470_5$ may extend in substantially the same direction (e.g., the same direction) as each other. For example, a conductive line $470_3$ and a conductive line $470_5$ may be physically coupled by a line segment 478 interposed between and connected to the conductive lines $470_3$ and $470_5$, where the line segment 478 may be substantially perpendicular to (e.g., perpendicular to) conductive lines $470_3$ and $470_5$.

Conductive line $470_3$, conductive line $470_5$, and line segment 478 of each conductor 477 form an opened-loop structure having substantially the same pattern (e.g., the same pattern) as an opened loop 447 in FIG. 4F that is transferred to the conductor 302. For example, each conductor 475 may be substantially "C" shaped. Note that each opened loop 447 in FIG. 4F, and thus each conductor 477, originates from the closed loop around each mask segment $425_2$ formed from a spacer $430_1$ and a spacer $430_2$ in FIG. 4A.

A conductive line $470_5$ of a conductor 477 may be successively adjacent to a conductive line $470_4$ of a conductor 475. The successively adjacent conductive lines $470_4$ and $470_5$ may be substantially parallel to (e.g., parallel to) each other and extend in substantially the same direction (e.g., the same direction) as each other, as shown in FIG. 4G.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. An integrated circuit, comprising:
   circuitry;
   a conductor coupled to the circuitry;
   a first conductive pad coupled to the conductor;
   a first conductive opened-loop structure coupled to the conductive pad, wherein the first conductive opened-loop structure would be floating but for its coupling to the first conductive pad, wherein the first conductive opened-loop structure comprises first and second portions connected together by a third portion of the first conductive opened-loop structure; and
   a second conductive opened-loop structure that would be floating but for its coupling to a second conductive pad, wherein the second conductive opened-loop structure comprises first and second portions connected together by a third portion of the second conductive opened-loop structure;
   wherein the first portion of the first conductive opened-loop structure is successively adjacent to the first portion of the second conductive opened-loop structure; and
   wherein the first portion of the first conductive opened-loop structure extends from the third portion of the first conductive opened-loop structure to between the first and second conductive pads in a same direction that the first portion of the second conductive opened-loop structure extends from the third portion of the second conductive opened-loop structure to between the first and second conductive pads.

2. The integrated circuit of claim 1, wherein the third portion of the first conductive opened-loop structure is substantially perpendicular to the first and second portions of the first conductive opened-loop structure.

3. The integrated circuit of claim 1, wherein the third portion of the second conductive opened-loop structure is substantially perpendicular to the first and second portions of the second conductive opened-loop structure.

4. The integrated circuit of claim 1, wherein the second portion of the first conductive opened-loop structure is in direct contact with the first conductive pad and the second portion of the second conductive opened-loop structure is in direct contact with the second conductive pad.

5. The integrated circuit of claim 1, wherein the conductor comprises two portions that are parallel to the first and second portions of each of the first and second conductive opened-loop structures and two portions that are perpendicular to the first and second portions of each of the first and second conductive opened-loop structures.

6. The integrated circuit of claim 5, wherein one of the two portions of the conductor that are perpendicular to the first and second portions of each of the first and second conductive opened-loop structures is between the two portions of the conductor that are parallel to the first and second portions of each of the first and second conductive opened-loop structures.

7. The integrated circuit of claim 1, wherein the conductor is spaced apart from the second portion of the first conductive opened-loop structure by a distance that is substantially equal to a distance that the first portion of the first conductive opened-loop structure is spaced apart from the first portion of the second conductive opened-loop structure.

8. The integrated circuit of claim 7, wherein the first and second portions of the first conductive opened-loop structure and the first and second portions of the second conductive opened-loop structure are spaced apart by substantially a same distance that is less than the distance that the conductor is spaced apart from the second portion of the first conductive opened-loop structure and the distance that the first portion of the first conductive opened-loop structure is spaced apart from the first portion of the second conductive opened-loop structure.

9. The integrated circuit of claim 1, wherein the first portion of the first conductive opened-loop structure and the first portion of the second conductive opened-loop structure are parallel to each other.

10. The integrated circuit of claim 1, wherein the first conductive opened-loop structure is substantially "C" shaped and the second conductive opened-loop structure is substantially "C" shaped.

11. The integrated circuit of claim 1, wherein the first conductive pad, the conductor, and the second portion of the first conductive opened-loop structure are integral.

12. The integrated circuit of claim 1, wherein the integrated circuit is a memory device.

13. The integrated circuit of claim 1, wherein the first conductor comprises two portions that are parallel to the first and second portions of each of the first and second conductive opened-loop structures and two portions that are perpendicular to the first and second portions of each of the first and second conductive opened-loop structures.

14. The integrated circuit of claim 13, wherein one of the two portions of the first conductor that are perpendicular to the first and second portions of each of the first and second conductive opened-loop structures is between the two portions of the first conductor that are parallel to the first and second portions of each of the first and second conductive opened-loop structures.

15. An integrated circuit, comprising:
   circuitry;
   a first conductor coupled to the circuitry;
   a first conductive pad coupled to the first conductor;
   a first conductive opened-loop structure coupled to the first conductive pad, wherein the first conductive opened-loop structure would be floating but for its coupling to the first conductive pad, wherein the first conductive opened-loop structure comprises first and second portions connected together by a third portion of the first conductive opened-loop structure;
   a second conductor coupled to other circuitry;
   a second conductive pad coupled to the second conductor; and
   a second conductive opened-loop structure coupled to the second conductive pad, wherein the second conductive opened-loop structure would be floating but for its coupling to the second conductive pad, wherein the second conductive opened-loop structure comprises first and second portions connected together by a third portion of the second conductive opened-loop structure;
   wherein the first portion of the first conductive opened-loop structure is successively adjacent to the first portion of the second conductive opened-loop structure; and
   wherein the first portion of the first conductive opened-loop structure extends from the third portion of the first conductive opened-loop structure to between the first and second conductive pads in a same direction that the first portion of the second conductive opened-loop structure extends from the third portion of the second conductive opened-loop structure to between the first and second conductive pads.

16. The integrated circuit of claim 15, wherein the first and second portions of the first conductive opened-loop structure are parallel to each other and are perpendicular to the third portion of the first conductive opened-loop structure and wherein the first and second portions of the second conductive opened-loop structure are parallel to each other and are perpendicular to the third portion of the second conductive opened-loop structure.

17. The integrated circuit of claim 15, wherein the first and second portions of the first conductive opened-loop structure are parallel to the first and second portions of the second conductive opened-loop structure.

18. An integrated circuit, comprising:
   circuitry;
   a first conductor coupled to the circuitry;
   a first conductive pad coupled to the first conductor;
   a first conductive opened-loop structure, wherein the first conductive opened-loop structure comprises first and second portions connected together by a third portion of the first conductive opened-loop structure, wherein the second portion of the first conductive opened-loop structure is coupled in direct physical contact with the first conductive pad, wherein the first conductive opened-loop structure would be floating but for its second portion being coupled in direct physical contact with the first conductive pad;
   a second conductor coupled to other circuitry;
   a second conductive pad coupled to the second conductor; and
   a second conductive opened-loop structure, wherein the second conductive opened-loop structure comprises first and second portions connected together by a third portion of the second conductive opened-loop structure, wherein the second portion of the second conductive opened-loop structure is coupled in direct physical contact with the second conductive pad, wherein the second conductive opened-loop structure would be floating but for its second portion being coupled in direct physical contact with the second conductive pad;
   wherein the first portion of the first conductive opened-loop structure is successively adjacent to the first portion of the second conductive opened-loop structure; and
   wherein the first portion of the first conductive opened-loop structure extends from the third portion of the first conductive opened-loop structure to between the first and second conductive pads in a same direction that the first portion of the second conductive opened-loop structure extends from the third portion of the second conductive opened-loop structure to between the first and second conductive pads.

19. The integrated circuit of claim 18, wherein the first portions of the of the first and second conductive opened-loop structures are not in direct physical contact with either the first conductive pad or the second conductive pad.

* * * * *